United States Patent [19]
Wallbillich et al.

[11] Patent Number: 4,927,740
[45] Date of Patent: May 22, 1990

[54] CLOSING AND/OR SEALING ORIFICES, CAVITIES OR SPACES IN PRINTING PLATES MOUNTED ON PLATE CYLINDERS

[75] Inventors: Guenter Wallbillich, Neustadt; Gerhard Bleckmann, Lampertheim; Dankmar Scholz, Frankenthal, all of Fed. Rep. of Germany

[73] Assignee: BASF Aktiengesellschaft, Ludwigshafen, Fed. Rep. of Germany

[21] Appl. No.: 262,629

[22] Filed: Oct. 21, 1988

[30] Foreign Application Priority Data

Oct. 26, 1987 [DE] Fed. Rep. of Germany ....... 3736180

[51] Int. Cl.$^5$ ........................... G03F 7/02; G03C 1/68

[52] U.S. Cl. .................................... 430/309; 430/281; 430/285; 430/307; 430/283; 430/328; 430/908; 430/906; 430/300; 101/415.1

[58] Field of Search ............... 430/307, 309, 281, 285, 430/954, 908, 917, 283, 328, 906; 101/415.1; 522/114

[56] References Cited

U.S. PATENT DOCUMENTS

| | | | |
|---|---|---|---|
| 2,056,991 | 10/1936 | Tomlin | 101/415.1 |
| 2,285,116 | 6/1942 | Grupe | 101/415.1 |
| 3,551,148 | 12/1970 | Faulhaber | 96/35.1 |
| 3,770,435 | 11/1973 | Volkert | 96/45 |
| 3,861,921 | 1/1975 | Hoffmann et al. | 96/86 P |
| 3,982,941 | 9/1976 | Inskip . | |
| 4,068,586 | 1/1978 | Frey et al. | 101/415.1 |
| 4,298,738 | 11/1981 | Lechtken | 546/22 |
| 4,324,744 | 4/1982 | Lechteken | 260/932 |
| 4,339,472 | 7/1982 | Tachibana | 427/44 |
| 4,416,215 | 11/1983 | Tachibana | 118/642 |
| 4,447,520 | 5/1984 | Henne et al. | 430/281 |
| 4,467,098 | 8/1984 | Koch et al. | 548/263 |
| 4,478,931 | 10/1984 | Fickes et al. | 430/309 |
| 4,515,375 | 5/1985 | Bleckmann et al. | 277/1 |
| 4,522,693 | 6/1985 | Henne et al. | 204/159.15 |
| 4,537,855 | 8/1985 | Ide | 430/285 |
| 4,548,894 | 10/1985 | Lynch et al. | 430/273 |
| 4,550,072 | 10/1975 | Lynch et al. | 430/256 |
| 4,635,549 | 1/1987 | Bleckmann | 101/401.1 |
| 4,758,500 | 7/1988 | Schober . | |
| 4,828,641 | 5/1989 | Werther et al. . | |

FOREIGN PATENT DOCUMENTS

| | | |
|---|---|---|
| 1176896 | 10/1984 | Canada . |
| 0040721 | 5/1981 | European Pat. Off. . |
| 0175189 | 3/1986 | European Pat. Off. . |
| 0286020 | 1/1989 | European Pat. Off. . |
| 3600774 | 4/1975 | Fed. Rep. of Germany . |
| 2545618 | 4/1977 | Fed. Rep. of Germany . |
| 2633445 | 1/1978 | Fed. Rep. of Germany . |
| 2160882 | 1/1986 | United Kingdom . |
| 1544748 | 4/1987 | United Kingdom . |

OTHER PUBLICATIONS

Deutscher Drucker, No. 41, (1975), pp. 17-22, No translation.

Fikentscher, Cellulose, Chemie, 13, (1932), pp. 58-64, No translation.

Modern Plastic Encyclopedia, 1972-73, p. 393.

*Primary Examiner*—Paul R. Michl
*Assistant Examiner*—Christopher D. RoDee
*Attorney, Agent, or Firm*—Keil & Weinkauf

[57] ABSTRACT

Orifices, cavities or spaces which are formed when printing plates are mounted on a plate cylinder are closed and/or sealed by means of a pasty, photocurable sealing or closing compound consisting of one or more photopolymerizable, ethylenically unsaturated low molecular weight compounds (a), one or more polymeric binder (b) which are compatible with the said compounds of component (a), one or more photopolymerization initiators (c) and one or more finely divided oxidic fillers (d) which, when mixed with components (a) to (c), give mixtures which are transparent to long-wavelength UV light. After it has been applied, this sealing or closing compound is cured by exposure and can then be mechanically processed. The process is particularly suitable for closing and/or sealing orifices, cavities or spaces in gravure printing plates mounted on plate cylinders.

9 Claims, No Drawings

CLOSING AND/OR SEALING ORIFICES, CAVITIES OR SPACES IN PRINTING PLATES MOUNTED ON PLATE CYLINDERS

The present invention relates to a method for closing and/or sealing orifices, cavities or spaces, such as those which occur, in particular in the region of the end or edge sections of the printing plates, when printing plates are mounted on plate cylinders, by means of a sealing or closing compound. The novel method is particularly suitable for closing and/or sealing such orifices, cavities or spaces in gravure printing plates mounted on plate cylinders.

It is known that rotary printing plates can be produced by wrapping flat printing plates around plate cylinders and fastening the said plates to the plate cylinders in a suitable manner, for example by adhesive bonding, magnetically or mechanically by means of suitable holding and clamping elements. By this means, it is possible to mount only one printing plate or a plurality of printing plates one behind the other and/or side by side on the surface of a plate cylinder. This method for production of rotary printing plates is becoming increasingly important, in particular in rotary gravure printing, owing to the simple and economical production and handling of wrap-round gravure printing plates. The wrap-round gravure printing plates are preferably mounted on the plate cylinder by bending over one or both of their end sections and hooking these bent-over regions into a groove provided for this purpose in the plate cylinder, with simultaneous clamping of the wrap-round gravure printing plate.

When flat printing plates are mounted on a plate cylinder, there is a break in the printing surface on the plate cylinder, in the form of gaps, clamping slots and other spaces or cavities, between the opposite, unbent or bent-over ends or end regions of a printing plate or, where a plurality of printing plates are mounted one behind the other and/or side by side on a plate cylinder, between the abutting edges of the end and/or lateral regions of the printing plates. Such orifices or spaces which form when printing plates are mounted on plate cylinders must be closed in a suitable manner in order to prevent penetration of printing ink, which may lead, for example, to elimination of the adhesive bond between the printing plate and the plate cylinder, in particular in gravure printing, to spraying of the printing ink and to undesirable impressions of the gap, and also to ensure smooth running of the doctor blade, thus preventing damage to the doctor blade and printing plate surface. Orifices and spaces can also form at the end faces of printing cylinders, between the plate cylinder surface and the lateral regions of the mounted printing plate or between the printing plate surface and metal rings mounted laterally with respect to the printing cylinder and limiting the printing surface, as is usual in rotary gravure printing, and, to avoid problems during printing, the said orifices and spaces have to be sealed to prevent penetration of printing ink or for other reasons.

It has already been proposed that the gaps or clamping slots formed when wrap-round gravure printing plates are clamped mechanically on plate cylinders be closed by means of sealing strips, bands or cords of resilient or plastically deformable materials (cf. for example U.S. Pat. Nos. 2,056,991, 2,285,116, DE-A-25 45 124 or DE-A-26 33 445). This method of gap closure is only of limited use, is expensive to carry out and frequently presents great difficulties owing to the adaptation of the profiled sealing strips to the shape of the orifice or joint to be closed and any subsequent surface processing required.

It is also known that the gaps, clamping slots or other orifices and spaces which are formed when printing plates are clamped on plate cylinders can be closed by filling with materials which reach the state required for their functioning only as a result of chemical reaction, heat, drying or the like, for example adhesives, thermoplastics, hotmelt adhesives, heat-curable or photocurable reaction resins or foams or liquid photopolymerizable materials. The use of such closing compounds for printing plates mounted on plate cylinders is described in, for example, Deutscher Drucker, No. 41 (1975), pages 17–22, DE-A-25 45 618, EP-A-118 866, EP-A-174 568, EP-A-175 189 and GB-A-2 160 882. With regard to adaptation of shape, these closing materials do not as a rule present any problems but frequently have inadequate resistance to the printing ink solvents and/or have mechanical weaknesses under the loads experienced in the printing process, in particular under the action of impression cylinders, material being printed and, in the case of gravure printing, also the doctor blade. Some of these known closing materials tend to exhibit embrittlement, so that small cracks form in the gap region after a short time and may fill with ink. It is precisely the combined effect of printing ink solvents and mechanical forces which not infrequently damage or even destroy these fillings or closing compounds. However, even if these closing compounds have chemical and mechanical stability sufficient to meet the requirements, it is, as a rule, tedious and expensive to apply them and to obtain the required properties, and their use is mainly restricted to the closing of relatively wide or large gaps, orifices or other cavities or spaces.

It is an object of the present invention to seal and/or close the orifices and spaces, eg. gaps, joints, holes, cavities and the like, which form during mounting and fixing of printing plates on printing cylinders, while avoiding the prior art disadvantages, with little expense and rapidly and effectively, so that an uninterrupted circular printing plate surface is obtained, which withstands the mechanical and chemical stresses which occur during printing.

It is a further object of the present invention to provide a method which makes it possible to adapt the sealing or closing compound to different plate types, in which the adhesion of these compounds in the cured state in the plate gap should be sufficiently high to fulfil its function during the printing process. It is a further object of the present invention to provide a method for sealing the plate gap and other orifices to be sealed, which makes it possible to remove the sealing and closing compound from the plate cleanly and without residues after the printing process and without damaging the printing plate.

We have found, surprisingly, that this object is achieved in a very advantageous manner by a method in which photocurable sealing and closing compounds which are pasty at room temperature are employed.

The present invention relates to a method for closing and/or sealing orifices, cavities or spaces, which are formed when printing plates are mounted on a plate cylinder, by means of a sealing or closing compound, wherein the sealing or closing compound used is a pasty, photocurable compound which is viscoplastic at room temperature and essentially consists of a photopolymerizable mixture of (a) from 10 to 90% by weight of one or more photopolymerizable, ethylenically unsaturated low molecular weight compounds, (b) from 5 to 75% by weight of one or more polymeric binders which are compatible with the photopolymerizable low molecular weight compounds of component (a), (c) from 0.01 to 10% by weight of one or more photopolymerization initiators and (d) from 3 to 40% by weight of one or more finely divided oxidic fillers which, when mixed with components (a) to (c), give mixtures which are transparent to long-wavelength UV light, with the proviso that the sum of the percentages stated under (a) to (d) is 100, and which, after application in and on the orifices, cavities or spaces to be closed or sealed, is cured by exposure and, if necessary, then mechanically processed.

The sealing or closing compound may additionally contain a polymerization inhibitor and from 0.1 to 2% by weight, based on the total amount of components (a) to (d), of a paraffin.

Examples of suitable components (a) are vinyl and/or acrylyl compounds, which may contain further functional groups, such as hydroxyl, carboxyl or amino groups, in particular vinylaromatics, such as styrene, and/or esters of $\alpha,\beta$-ethylenically unsaturated carboxylic acids with monohydric or polyhydric alcohols, such as the esters of acrylic acid or methacrylic acid with a monohydric alcohol.

Examples of suitable components (b) are styrene/maleic half-ester copolymers and/or one or more unsaturated polyesters.

In a preferred embodiment of the invention, a mixture of (b1) a styrene/maleic half-ester copolymer (b2) a hard unsaturated polyester based on phthalic acid/maleic acid/ethylene glycol/propylene glycol and (b3) a soft unsaturated polyester based on adipic acid/phthalic acid/maleic acid/dipropylene glycol/propylene glycol is used as component (b).

Preferred finely divided oxidic fillers (d) are silica and aluminum hydroxide, having particle diameters of from 0.01 to 10 μm, preferably from 0.01 to 5 μm.

Although the novel method is applicable to all types of printing plates mounted on plate cylinders, for example letterpress and flexographic printing plates, it has proven particularly advantageous for gravure printing plates mounted on plate cylinders. By employing the sealing and closing compounds to be used according to the invention, the penetration of even low-viscosity printing ink into the stated orifices, cavities or spaces is prevented and the resulting disadvantages avoided. The adhesion of the sealing and closing compounds used according to the invention in the cured state in the plate gap ensures trouble-free printing. When printing is complete, the sealing and closing compound can, however, be removed cleanly from the plate without leaving a residue and without damaging the plate. It was also surprising that the orifices, cavities or spaces closed and/or sealed by the novel method have excellent chemical and mechanical stability and permanence under the wear and tear of printing and have no weaknesses, and the rotary gravure printing plates produced by the novel method allow the doctor blade to slide uniformly, smoothly and without jolts on the printing plate surface, without damaging the latter. The novel method is particularly advantageous since it is universely applicable. The sealing and closing compound to be used according to the invention is simple and easy to process in the novel method. On the one hand, it can be uniformly distributed in the gap cavity while on the other hand it is possible to seal the gap cavity at the ends of the cylinder without additional expensive measures having to be taken. Although the novel method is suitable for closing and/or sealing any types of orifices, cavities or spaces in printing plates mounted on plate cylinders, it is particularly suitable and readily and advantageously applicable to the closing and/or sealing of small or narrow gaps, joins, other orifices, spaces and the like.

The conventional photopolymerizable ethylenically unsaturated low molecular weight compounds, in particular those having boiling points above 100° C., for example vinylaromatics, such as styrene, acrylyl and methacrylyl compounds, which may contain further functional groups, such as hydroxyl, carboxyl or amino groups, and allyl compounds, eg. allyl alcohol, and esters of $\alpha,\beta$-ethylenically unsaturated carboxylic acids, eg. esters of appropriate mono- or dicarboxylic acids, such as acrylic acid, methacrylic acid, maleic acid or itaconic acid, with monoalcohols of 1 to 12, in particular 1 to 8, carbon atoms, are suitable as component (a) for the novel method, such compounds being known per se. Preferred monomers are those whose photopolymerizable ethylenic double bonds are activated by conjugation or proximity to O, N or S atoms. The photopolymerizable ethylenically unsaturated low molecular weight compounds to be used according to the invention can be either monofunctional or polyfunctional, i.e. they may contain one or more photopolymerizable, ethylenic double bonds in the molecule.

The photopolymerizable, ethylenically unsaturated low molecular weight compounds to be used according to the invention as component (a) of the closing compounds include the N-vinyl compounds and the $\alpha,\beta$-olefinically unsaturated mono- or dicarboxylic acids and appropriate derivatives thereof. Examples of the N-vinyl monomers are the N-vinyllactams, in particular N-vinylpyrrolidone and N-vinylcaprolactam. Particularly important $\alpha,\beta$-olefinically unsaturated carboxylic acids are acrylic acid and methacrylic acid. Particularly advantageous photopolymerizable monomers include derivatives of the $\alpha,\beta$-olefinically unsaturated carboxylic acids, in particular derivatives of acrylic or methacrylic acid, such as hydroxyalkyl (meth)acrylates, (meth)acrylamide or derivatives of (meth)acrylamide. Examples of the hydroxyalkyl (meth)acrylates, where alkyl is preferably of 2 to about 20, in particular 2 to 8, carbon atoms, are 2-hydroxyethyl (meth)acrylate, 2-hydroxypropyl (meth)acrylate, 3-hydroxypropyl (meth)acrylate, 1,4-butanediol mono(meth)acrylate and hexanediol mono(meth)acrylate. Mono(meth)acrylates of polyalkylene glycols, e.g. di-, tri- or tetraethylene glycol mono(meth)acrylate, are also suitable. Examples of the derivatives of (meth)acrylamide which are also suitable, according to the invention, as monomers are N-methylol(meth)acrylamide and its diethers with diols, for example the reaction product of 2 moles of N-methylol(meth)acrylamide with 1 mole of ethylene glycol. Preferred components are hydroxyalkyl (meth)arcylates of the abovementioned type and mixtures of these with styrene.

The choice of the photopolymerizable low molecular weight compounds used as component (a) depends, inter alia, on the type of polymeric binder which is concomitantly used as component (b) and with which the photopolymerizable low molecular weight compounds should be compatible, and also on the desired properties of the cured closing compound. The photopolymerizable low molecular weight compounds can be used alone or as a mixture with one another. For example, the mechanical properties of the cured closing compound and of the gap closed with it can be varied and adjusted to the desired extent via the type and amount of the monomers used or, where monomer mixtures are used, also via the ratio in which the monomers are mixed with one another. The pasty closing compounds to be formulated for the novel method contain in general from 10 to 90, in particular from 20 to 50, % by weight, based on the total closing compound, of the photopolymerizable low molecular weight compounds (a). The viscosity of the closing compound can also be adjusted and varied through the amount of the photopolymerizable low molecular weight compounds (a).

In addition, the closing compounds to be used for the novel process contain, as component (b), one or more polymeric binders which are compatible with the photopolymerizable low molecular weight compounds of component (a). The polymeric binder chosen is resistant to the toluene-containing, gasoline-containing, ketone-containing and/or ester-containing printing ink solvents conventionally used in gravure printing. One class of very suitable polymeric binders consists of the styrene/-maleic half-ester copolymers. These copolymers frequently contain the styrene and maleic half-ester comonomers in a molar ratio of about 1:1. However, other comonomer ratios are also possible; in addition, the copolymers can also contain other comonomers, e.g. maleic anhydride and/or (meth)acrylates, as copolymerized units. The styrene/maleic half-ester copolymers generally have a softening point above 150° C., in particular above 180° C., and a mean molecular weight of about 5,000–50,000. Another class of very suitable polymeric binders for the closing compounds to be used according to the invention consists of the linear synthetic polyamides, in particular the linear soluble copolyamides, having repeating amide groups in the main chain of the molecule, for example those which are known per se as polymeric binders for photopolymerizable recording materials and are described in, inter alia, French Patent 1,520,856 and DE-A-22 02 357. Particularly suitable copolyamides are those which have been prepared by cocondensation of a mixture of one or more lactams, in particular caprolactam, and one or more dicarboxylic acid/diamine salts, for example from ξ-caprolactam, hexamethylenediammonium adipate and the 4,4′-diaminodicyclohexylmethane/adipic acid salt. The polyamides used according to the invention preferably have a K value (according to Fikentscher, Cellulose-Chemie, 13 (1932), 58) of from 20 to 80, in particular from 30 to 70.

Unsaturated polyesters have also proven particularly advantageous polymeric binders (b) for the novel process.

Unsaturated polyesters can usually be prepared by polycondensation of α-unsaturated polybasic carboxylic acids, in particular dicarboxylic acids, or their anhydrides with polyhydric, preferably dihydric, alcohols. Some of the α-unsaturated dicarboxylic acids can be replaced with aromatic and/or saturated dicarboxylic acids. Examples of suitable unsaturated dicarboxylic acids are maleic acid, fumaric acid, itaconic acid, citraconic acid and mesaconic acid. Examples of suitable aromatic dicarboxylic acids are phthalic acid, isophthalic acid and terephthalic acid. For example, succinic acid, glutaric acid, α-methylglutaric acid, adipic acid or sebacic acid can be concomitantly used as saturated dicarboxylic acids.

Particularly suitable polyhydric alcohols for the preparation of the polyesters are the conventional dihydric alcohols, e.g. ethylene glycol, propylene 1,2-glycol, butylene 1,3-glycol, butane-1,4-diol, hexane-1,6-diol, diethylene glycol, dipropylene glycol, triethylene glycol or 2,2-dimethylenepropane-1,3-diol, and also certain amounts of alcohols of higher functionality, e.g. glycerol, pentaerythritol or trimethylolpropane.

Particularly preferred unsaturated polyesters are those based on phthalic acid/maleic acid/ethylene glycol/propylene glycol, which are commercially available in, for example, solution in styrene (with about 35% by weight styrene content) and, after the polymerization, give tensile strengths of about 70 $N/mm^2$, a flexural modulus of elasticity of about 4,000 $N/mm^2$ and a glass transition temperature of about 95° C.

Such general purpose polyester resins can be elastified or rendered flexible by mixing with other polyester resins, for example those based on adipic acid/phthalic acid/maleic acid/dipropylene glycol/propylene glycol, which are likewise available commercially in solution in styrene (for example with about 25% styrene content) and as such, after the polymerization, give substantially lower tensile strengths and glass transition temperatures which are below room temperature; this procedure is familiar to the skilled worker. Mixtures of these two polyester types are preferred. These mixtures can advantageously also be combined with styrene/maleic half-ester copolymers.

Preferably used components (b) are polymeric binders which are soluble in the photopolymerizable, ethylenically unsaturated low molecular weight compounds used as component (a). However, it is also possible to use, as component (b), polymeric binders which are merely dispersible in the photopolymerizable low molecular weight compounds of component (a), provided that the said compounds and the polymeric binders are compatible with one another and can be processed to give a homogenous free-flowing mixture. The content of the polymeric binders component (b) in the novel closing compounds is in general from 5 to 75, in particular from 25 to 50, % by weight, based on the total closing compound.

In addition to the photopolymerizable, low molecular weight compounds of the type under discussion and the polymeric binders, the closing compounds to be used for the novel process contain, as component (c), one or more photopolymerization initiators, in particular in an amount of from 0.01 to 10, preferably from 0.1 to 2, % by weight, based on the total closing compound. According to the invention, suitable compounds for this purpose are the compounds known per se and conventionally used as photoinitiators for photocurable materials. These include, in particular, benzoin and benzoin derivatives, such as benzoin alkyl ethers, in particular those where alkyl is of 1 to 8 carbon atoms, for example benzoin monomethyl ether or benzoin isopropyl ether, α-hydroxymethylbenzoin and its alkyl ethers, such as α-hydroxymethylbenzoin methyl ether, and α-methylbenzoin and its ethers; benzil and benzil derivatives, in particular benzil monoketals, such as benzil dimethyl ketal, benzil methyl ethyl ketal or benzil methyl benzyl ketal; the acylphosphine compounds which are effective photoinitiators, as described in, for example, German Laid-Open Applications DOS 2,830,927, DOS 2,909,994, DOS 3,020,092, DOS 3,034,697, DOS 3,114,314 and DOS 3,133,419 and typical examples of which are 2,4,6-trimethylbenzoyldiphenylphosphine oxide, ethyl 2,4,6-trimethylbenzoylphenylphosphinate, ethyl 2,4,6-trimethylbenzoylphenylphosphinate and 2,4,6-trimethylbenzoylbis-(o-toluyl)phosphine oxide; derivatives of α-hydroxyacetophenone, e.g. 1-phenyl-2-hydroxy-2-methyl-1-propanone, 1-(p-isopropylphenyl)-2-hydroxy-2-methyl-1-propanone and 1-hydroxy-1-benzoylcyclohexane; and benzophenone, Michler's ketone, fluorenone, anthraquinone, xanthone, thioxanthone and acridone, as well as the derivatives of these compounds which are known per se as photoinitiators and are commonly used. The photopolymerization initiators may be present alone or as a mixture with one another in the novel closing compounds; they can also be used together with the activators known per se for these photoinitiators, amine compounds being mainly suitable as activators.

One or more finely divided oxidic fillers which, when mixed with the components (a) to (c), give mixtures which are transparent to long-wavelength UV light are used as component (d) for the novel process. The particle size of these fillers is in general from 0.01 to 10 μm, preferably from 0.01 to 5 μm. Examples of such fillers are colloidal or hydrophobic silica, microtalc, micromica, kaolin, aluminas and aluminum hydroxides. Silica (e.g. Aerosil® from Degussa) and aluminum hydroxide (e.g. Martinal® from Martinswerk) and mixtures of these are particularly preferred.

It is particularly advantageous to use aluminum hydroxide of the hydrargillite type as component (d) for the novel process if, for example, it has 80% of particles with sizes from 0.2 to 3.0 μm or a lamellar structure. Apart from the fact that this reduces the polymerization shrinkage and increases the strength, smooth surfaces and substantially lower tendency to cracking during curing are obtained. Furthermore, there are only small differences between the refractive index of the aluminum hydroxide and that of the resin component (b) or of its mixture with component (a).

Furthermore, the addition of finely divided silica helps to thicken the mixture of components (a)+(b) and imparts thixotropic properties to the said mixture, serves as a sedimentation initiator for other fillers and gives greater strength on curing. Hydrophillic and hydrophobic finely divided silica grades which, for example, have particle sizes of about 12 or 14 nm are particularly advantageous. The hydrophobic finely divided silica grades are generally preferred for unsaturated polyester resins.

Component (d) is present in amounts of from 3 to 40, preferably from 5 to 30, % by weight in the compounds to be used according to the invention.

Further assistants and additives, such as paraffin (e.g. a paraffin having a solidification point of from 56° to 58° C.), in general in amounts of from 0.1 to 2% by weight, based on the total amount of components (a)+(b), or polymerization inhibitors, for example thermal polymerization inhibitors, such as hydroquinone, hydroquinone derivatives, 2,6-di-tert-butyl-p-cresol, nitrophenols, N-nitrosamines, such as N-nitrosodiphenylamine, or the salts, in particular the alkali metal and ammonium salts, of N-nitrosocyclohexylhydroxylamine, can be added to the compounds to be used according to the invention. Pigments and dyes can be useful for visual observation during gap filling and for the assessment of the gap closure. By adding plasticizers, the viscosity and the flow behavior of the novel photocurable closing compounds can be varied and controlled, and mechanical properties of the cured gap filling, for example toughness and resilience, can be influenced. Particularly suitable plasticizers are low molecular weight compounds, such as the known phthalates, or hydroxyl-containing compounds, e.g. glycerol, ethylene glycol and the like, which are compatible with components (a) and (b) of the novel closing compounds.

Examples of very suitable closing compounds to be used according to the invention are homogenous photopolymerizable mixtures which, in addition to photoinitiators (c) and finely divided oxidic fillers of the abovementioned type (d), contain a styrene/maleic half-ester copolymer as polymeric binder (component (b)) and hydroxyalkyl acrylates and/or hydroxyalkyl methacrylates as photopolymerizable, ethylenically unsaturated low molecular weight compounds (component (a)), in the ratios stated above for these components. These very advantageous closing compounds to be used according to the invention and containing styrene/maleic half-ester copolymers as polymeric binders contain, as component (a), in particular a mixture of hydroxyalkyl acrylates and hydroxyalkyl methacrylates, for example a mixture of 2-hydroxyethyl acrylate and 2-hydroxyethyl methacrylate.

Other examples of closing compounds to be used according to the invention and with which very advantageous results have likewise been obtained are homogeneous mixtures which contain not only photopolymerization initiators (c) and finely divided oxidic fillers of the abovementioned type (d) but also a soluble copolyamide as polymeric binder (b) and (meth)acrylic acid and/or hydroxyalkyl (meth)acrylates as photopolymerizable, ethylenically unsaturated low molecular weight compound (a). Particularly suitable copolyamides are the copolyamides mentioned above, which are prepared by cocondensation of a mixture of one or more lactams, in particular caprolactam, and one or more dicarboxylic acids/diamine salts; a mixture of (meth)acrylic acid and hydroxyalkyl (meth)acrylates, for example of acrylic acid and 2-hydroxyethyl methacrylate, is advantageously used as the photopolymerizable, low molecular weight compound, these monomer mixtures generally predominantly containing hydroxyalkyl (meth)acrylate, for example about 50–80% by weight, based on the monomer mixture, of the said (meth)acrylate. Even in these mixtures for closing compounds, the amounts of the individual components of the mixture in the closing compound are preferably in the ranges stated generally above for these components.

In general, it has been found that where very good adhesion of the cured closing compounds to the gravure printing plates is desired, particularly advantageous closing compounds are those in which either the photopolymerizable, ethylenically unsaturated low molecular weight compounds of component (a) or the polymeric binders used as component (b) contain free carboxyl groups. In the preferred mixtures, the amount of free COOH groups in component (a) and/or component (b) is about 0.5–10% by weight, based on the sum of components (a)+(b), the weight of a free carboxyl group being taken as 45.

It is essential that the amounts of the components used for the novel process are matched with one another within the abovementioned limits so that the photocurable sealing or closing compound has a pasty consistency at room temperature, i.e. does not flow under its own weight.

The pasty photocurable closing compounds to be used for the novel process are suitable for gap closure in all gravure printing plates which can be clamped on the plate cylinder of a sheet-fed or web-fed rotary gravure printing press, such as the conventional gravure printing plates made of metal and having a Ballard skin or made of solid copper, where the printing surface may be chromiumplated in a conventional manner. However, the novel closing compounds are particularly advantageous for gap closure in the case of gravure printing plates which have plastic printing layers and are clamped on plate cylinders. In the gravure printing plates having plastic printing layers, a plastic layer into which the ink-receiving indentations (wells) are introduced is applied to a suitable printing layer base. These wells may have been formed in the plastic printing layer by mechanical engraving or laser-engraving (cf. for example DE-A-27 52 500 or DE-A-30 28 098) or, in the case of photopolymeric gravure printing plates, may have been introduced into the photosensitive plastic printing layer by imagewise exposure and development (cf. DE-A-20 61 287, DE-A-31 28 949 and DE-A-31 28 951). The said closing compound is very advantageously used in the case of wrapround gravure printing plates for closing the gap formed between the ends of the printing plate when these wrapround plates are clamped on a plate cylinder. However, it is also suitable for closing the gaps which occur between the end regions and/or lateral edges of the individual gravure printing plates when a plurality of such plates are mounted one behind the other and/or side by side on a single plate cylinder, for example by means of saddle constructions known per se and suitable for this purpose. Another particular advantage of the said closing compounds is that broad and deep gaps, which can occur between the abutting edge regions of the gravure printing plate when such plates are clamped on a plate cylinder, can be readily and very permanently closed using the said compounds. For the purposes of the present invention, gravure printing plates are the ready-prepared gravure printing plates in which the ink-conveying indentations have already been incorporated as well as the gravure printing plate blanks in which the wells have not yet been formed, i.e. it is also possible to clamp a ready-prepared gravure printing plate on the plate cylinder and then to fill the resulting gap with the said closing compound, or first to clamp gravure printing plate blanks on the plate cylinder, then to fill the resulting gap with the closing compound and only thereafter to introduce the wells into the printing layer of the printing plates. Clamping of the gravure printing plates on the plate cylinders is known per se and is effected, for example, by means of permanent magnets or by mechanical means for fastening and clamping the printing plates. The plate cylinders generally used for this purpose are those where the gravure printing plates are fastened and clamped in a groove or a cylinder gap by hooking in and anchoring one or both, preferably both, plate ends, which have been bent over for this purpose.

In the novel process, in order to close the gaps formed when the gravure printing plates are clamped on the plate cylinders, the closing compound can be introduced into the gap by any method or process suitable for pasty materials, provided that uniform and complete filling of the gap cavity is ensured.

The viscoplastic, curable pasty compounds to be used in the novel process as sealing or closing compounds can be applied, for example, in a very simple manner by simply applying the said compounds, for example from a tube, cartridge or similar metering apparatus, onto the areas of the printing plates and/or plate cylinders to be sealed and simply mechanically pressing the said compounds against or into the orifices or cavities to be closed, for example by means of a spatula, a scraper or the like. Excess closing material can then readily be removed by simply wiping it away from the printing plate surface or the ends of the resulting printing plate cylinder. Thus, according to the invention, special apparatuses or resources for closing and/or sealing the orifices and gaps are dispensed with. Aftertreatment can frequently be omitted; as a rule, however, it is advantageous to smooth the surface of the cured compound by subsequent mechanical processing, for example by grinding, milling and/or polishing, and to adapt the said surface to the contour of the cylinder. To remove the printing plates from the plate cylinder, no special apparatuses or efforts are required. The extent of adhesion between the gap closing compound and the printing plate can be controlled by changing the proportions of components (a) and (b), preferably the various polymer constituents of components (b). This is another particular advantage of the novel process. Used printing plates can be reused without limit.

After the gaps have been filled, the pasty photocurable closing compound is cured by exposure to actinic light. All known light sources capable of emitting light in the actinic wavelength range for the closing compounds, in particular in a wavelength range from about 250 to 450 nm, can be used for this purpose, for example carbon arc lamps, actinic or superactinic fluorescent tubes, low pressure, medium pressure or high pressure mercury lamps, which may be doped, xenon lamps or lasers having a high UV component.

EXAMPLE 1

200 g of a finely divided aluminum hydroxide and then 35 g of a finely divided silica are added to a homogeneous mixture of 240 g of a copolymer of styrene/maleic half-ester (mean molecular weight 10,000), 560 g of hydroxyethyl acrylate, 1 g of the potassium salt of N-nitrosocyclohexylhydroxylamine and 2 g of the photoinitiator trimethylbenzoyldiphenylphosphine trioxide, while stirring thoroughly. All operations are carried out in the absence of UV light. After thorough homogenization with gentle heating, the mixture is devolatilized under reduced pressure in a stirred container.

The pasty compound is introduced, by means of a tube, into the inwardly sealed gap between the ends of a printing plate fixed on a cylinder. The compound is scraped smooth and then cured by exposure to ultraviolet light.

The mechanical properties and the adhesion of the gap closure thus produced are so good that it withstands long print runs without problems. To remove the plate, the closure must be separated mechanically.

EXAMPLE 2

A mixture of 100 g of a copolymer of styrene/maleic half-ester (mean molecular weight 10,000), 232 g of hydroxyethyl acrylate and 0.4 g of the potassium salt of N-nitrosocyclohexylhydroxylamine is homogenized at elevated temperatures with a second mixture of 140 g of a styrene-containing (about 35% by weight of styrene) polyester resin (o-phthalic acid/maleic acid/ethylene glycol/propylene glycol, viscosity 700–800 mPa.s at 23° C.), 60 g of a soft styrene-containing (about 25% by weight of styrene) polyester resin (adipic acid/o-phthalic acid/maleic acid/dipropylene glycol/propylene glycol, viscosity 1,100–1,300 mPa.s at 23° C.) and 1.4 g of trimethylbenzoyldiphenylphosphine oxide, 0.1 g of benzil dimethyl ketal and 0.02 g of hydroquinone monomethyl ether. Thereafter, 254 g of a finely divided aluminum hydroxide and 30 g of a finely divided silica are added and are stirred in uniformly. Devolatilization is then carried out under reduced pressure.

The gap between the ends of the printing plate is closed as described in Example 1. The closure also has virtually the same properties. However, during removal of the plate, it becomes detached more readily from the plate ends, so that it can be removed completely without damaging the plate.

EXAMPLE 3

A mixture of 80 g of the styrene/maleic half-ester copolymer, 186 g of hydroxyethyl acrylate and 0.25 g of the potassium salt of N-nitrosocyclohexylhydroxylamine is homogenized at elevated temperatures with a mixture of 172 g of the hard polyester resin (Example 2), 74 g of the soft polyester resin (Example 2), 0.9 g of trimethylbenzoyldiphenylphosphine oxide, 0.1 g of benzil dimethyl ketal and 0.025 g of hydroquinone monomethyl ether by a procedure similar to that in Example 2. Thereafter, 245 g of a finely divided aluminum hydroxide and then 30 g of a finely divided silica are stirred in to give a homogeneous mixture.

The resulting compound is further treated as in the preceding Example and is processed to give a satisfactorily functioning gap closure. During removal of the printing plate, the major part of the closing compound becomes detached from the plate ends under mechanical action; to allow the plate to be used again subsequently, the few residues of closing compound which still adhere can be easily removed mechanically.

We claim:

1. A process for closing and sealing orifices, cavities or spaces, which are formed when printing plates are mounted on a plate cylinder, which comprises: applying to the orifices, cavities or spaces a sealing or closing compound which is a pasty, photocurable compound which is viscoplastic at room temperature and essentially consists of a photopolymerizable mixture of (a) from 10 to 50% by weight of one or more photopolymerizable, ethylenically unsaturated low molecular weight compounds, (b) from 25 to 50% by weight of a mixture of the components 1) a styrene/maleic half-ester copolymer or a linear soluble copolyamide, and 2) at least one unsaturated polyester, which components are compatible with the photopolymerizable low molecular weight compounds of component (a), (c) from 0.01 to 10% by weight of one or more photopolymerization initiators and (d) from 3 to 40% by weight of one or more finely divided oxidic fillers which, when mixed with components (a) to (c) give mixtures which are transparent to long-wavelength UV light, with the proviso that the sum of the percentages stated under (a) to (d) is 100, and thereafter exposing the photopolymerizable mixture in the orifices, cavities or spaces to be closed or sealed, to actinic light.

2. The process of claim 1, wherein the sealing or closing compound additionally contains a polymerization inhibitor.

3. The process of claim 1, wherein the sealing or closing compound contains from 0.1 to 2% by weight, based on the total amount of components (a)+(b), of a paraffin.

4. The process of claim 1, wherein one or more vinyl and/or (meth)acrylyl compounds, which may contain further functional groups, such as hydroxyl, carboxyl or amino groups, are used as component (a).

5. The process of claim 1, wherein a vinylaromatic, an ester of an $\alpha,\beta$-ethylenically unsaturated carboxylic acid with a monohydric or polyhydric alcohol or a mixture of a vinylaromatic and an ester of $\alpha,\beta$-ethylenically unsaturated carboxylic acid with a monohydric or polyhydric alcohol is used as component (a).

6. The process of claim 5, wherein styrene, an ester of acrylic acid or methacrylic acid with a polyhydric alcohol or a mixture of styrene and an ester of acrylic acid or methacrylic acid with a polyhydric alcohol is used as component (a).

7. The process of claim 1, wherein a mixture of a styrene/maleic half-ester copolymer and one or more unsaturated polyesters is used as component (b).

8. The process of claim 7, wherein a mixture of ($b_1$) a styrene/maleic half-ester copolymer, ($b_2$) a hard unsaturated polyester based on phthalic acid/maleic acid/ethylene glycol/propylene glycol and ($b_3$) a soft unsaturated polyester based on adipic acid/phthalic acid/maleic acid/dipropylene glycol/propylene glycol is used as component (b).

9. The process of claim 1, wherein aluminum hydroxide, silica or a mixture of aluminum hydroxide and silica is used as the finely divided oxidic filler.

* * * * *